United States Patent [19]
Harmsen et al.

[11] Patent Number: 6,071,107
[45] Date of Patent: *Jun. 6, 2000

[54] APPARATUS FOR ENCAPSULATING PRODUCTS

[75] Inventors: Wilhelmus Hendrikus Johannes Harmsen, Wehl; Albertus Franciscus Gerardus Van Driel, Gendt; Stijn Klaas Tjeerd Zoethout, Nijmegen; Lambertus Franciscus Wilhelmus Van Haren, Druten; Robert Jan Willem Stemerdink, Arnhem, all of Netherlands

[73] Assignee: Fico B.V., Didam, Netherlands

[ * ] Notice: This patent issued on a continued prosecution application filed under 37 CFR 1.53(d), and is subject to the twenty year patent term provisions of 35 U.S.C. 154(a)(2).

[21] Appl. No.: 08/876,942

[22] Filed: Jun. 16, 1997

[30] Foreign Application Priority Data

Jun. 18, 1996 [NL] Netherlands ............................ 1003366

[51] Int. Cl.⁷ ............................. B29C 45/02; B29C 45/42
[52] U.S. Cl. .......................... 425/116; 425/121; 425/150; 425/226; 425/436 RM; 425/544; 264/272.11
[58] Field of Search ..................................... 264/250, 255, 264/273, 274, 275, 272.11, 272.15, 272.17, 272.13; 425/116, 121, 123, 126.1, 129.1, 544, 150, 226, 436 RM

[56] References Cited

U.S. PATENT DOCUMENTS

| | | | |
|---|---|---|---|
| 2,655,692 | 10/1953 | Fay | 249/91 |
| 4,684,202 | 8/1987 | House et al. | 264/263 |
| 4,994,224 | 2/1991 | Itoh et al. | 425/126.1 |
| 5,297,897 | 3/1994 | Venrooij et al. | 425/121 |
| 5,395,573 | 3/1995 | Taguchi | 425/121 |
| 5,527,173 | 6/1996 | Miller et al. | 425/126.1 |
| 5,527,174 | 6/1996 | Godin et al. | 425/126.1 |
| 5,756,029 | 5/1998 | Nakamichi et al. | 264/273 |

*Primary Examiner*—Angela Ortiz
*Attorney, Agent, or Firm*—Limbach & Limbach LLP

[57] ABSTRACT

Apparatus for encapsulating products, for instance encapsulating lead frames with epoxy resin, wherein the apparatus comprises:
- one or more pressing devices for encapsulating the products at increased pressure and/or temperature;
- a first carriage device for transferring the products from supply means to the pressing device; and
- a second carriage device for discharging the encapsulated products from the pressing device to discharge means, wherein the first and second carriage are guidable along collective guide means.

17 Claims, 11 Drawing Sheets

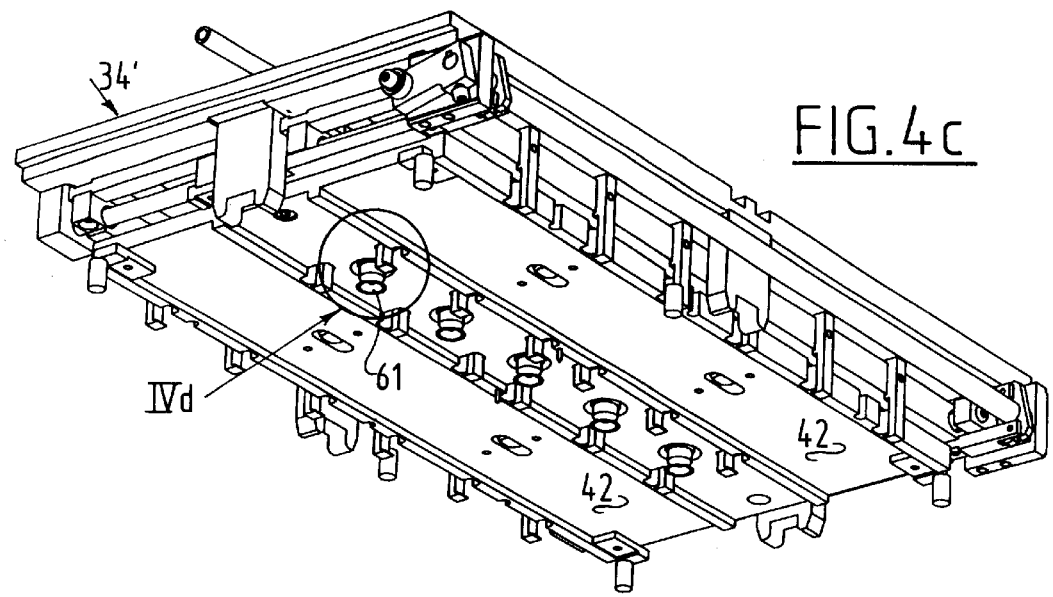
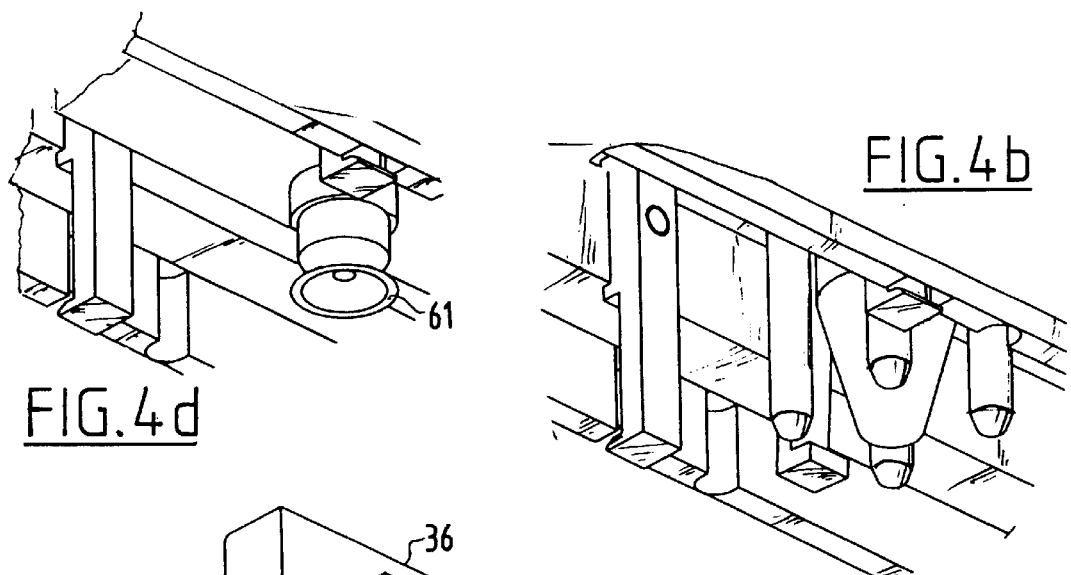
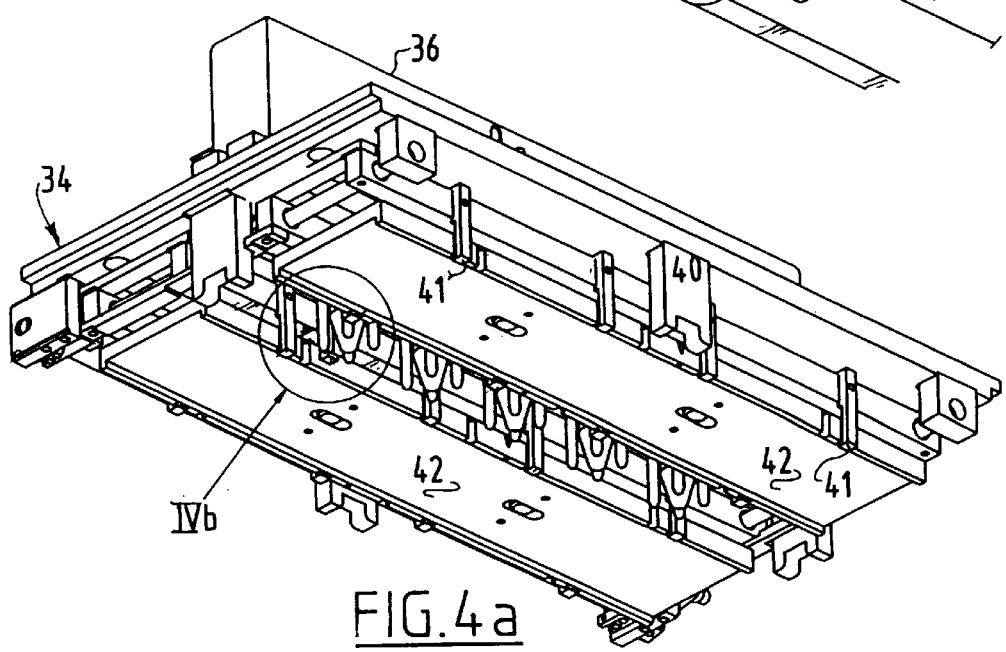

APPARATUS FOR ENCAPSULATING PRODUCTS

The demand for electronic circuits is fast-growing. Applicant is specialized in the encapsulation in a pressing device of semiconductor products, so-called lead frames, with epoxy resin. On account of the increasing demand for semiconductor products there is a need for an apparatus and method for encapsulating such products at great speed and in large quantities.

Described in the Netherlands patent application 94.01930 is an apparatus wherein a carriage is movable along one or more presses for feeding the lead frames from a loading cassette to one or a plurality of adjacently arranged presses and for discharging thereof from the presses to a discharge cassette. This modular structure has the advantage that the number of presses can be increased or reduced in accordance with the requirement of the customer, wherein the basic structure of the apparatus can remain substantially unchanged.

The present invention provides an apparatus for encapsulating products, for instance encapsulating lead frames with epoxy resin, wherein the apparatus comprises:
   one or more pressing devices for encapsulating the products at increased pressure and/or temperature;
   a first carriage device for transferring the products from the supply means to the pressing device; and
   a second carriage device for discharging the encapsulated products from the pressing device to discharge means, wherein the first and second carriage are guidable along collective guide means.

Productivity is further increased with the apparatus according to the present invention and the functions of inserting and removing the lead frames can be further improved because the relevant carriage can be designed for this purpose.

A carriage for use in the apparatus according to the present invention preferably comprises an upper and a lower part, wherein product-specific parts are as far as possible interchangeable. In addition, the first and the second carriage are mutually comparable in that on the outer end thereof either a suction mouth or brushing means and drive means for these brushing means can be arranged thereon.

In order to drive the carriages use is preferably made of a so-called linear electric motor whereby the carriage can be moved at relatively great speed through a distance of about two metres along the guide means in reproducible manner, for instance with an absolute accuracy of 0.3 mm and a reproducible accuracy of 0.03 mm. A linear motor is extremely reliable, displays little wear and has a high speed range, i.e. it is highly suitable for both accurate movements at low speeds and reproducible movements at high speeds.

Due for instance to heating and cooling of the pressing devices and other components of the apparatus according to the present invention it is possible, for instance if more than one pressing device is incorporated in the apparatus according to the present invention, for inaccuracies to occur in the positioning of a carriage in relation to a pressing device (or the supply or discharge means). In order to offset these inaccuracies the pressing devices and/or their carriages are preferably provided with sensor means for monitoring and/or calibrating the position of a carriage relative to this pressing device.

In preference a carriage is provided with air ducts which are slidable in and out of each other and which, compared with hoses, are more reliable and give less chance of failure than such hoses which can easily be ripped during the movements at high speed and result in standstill of the entire apparatus.

The present invention further provides a carriage for use in an apparatus according to the present invention, in addition to a method.

Further advantages, features and details of the present invention will be elucidated in the light of the following description of a preferred embodiment thereof with reference to the annexed drawings, in which:

FIG. 4a shows a bottom view in perspective of a part of a supply carriage;

FIG. 4b shows a view in perspective of detail IVb of FIG. 4a;

FIG. 4c shows a view in perspective of a part of a discharge carriage;

FIG. 4d shows a view in perspective of detail IVd of FIG. 4c;

Figure 1:
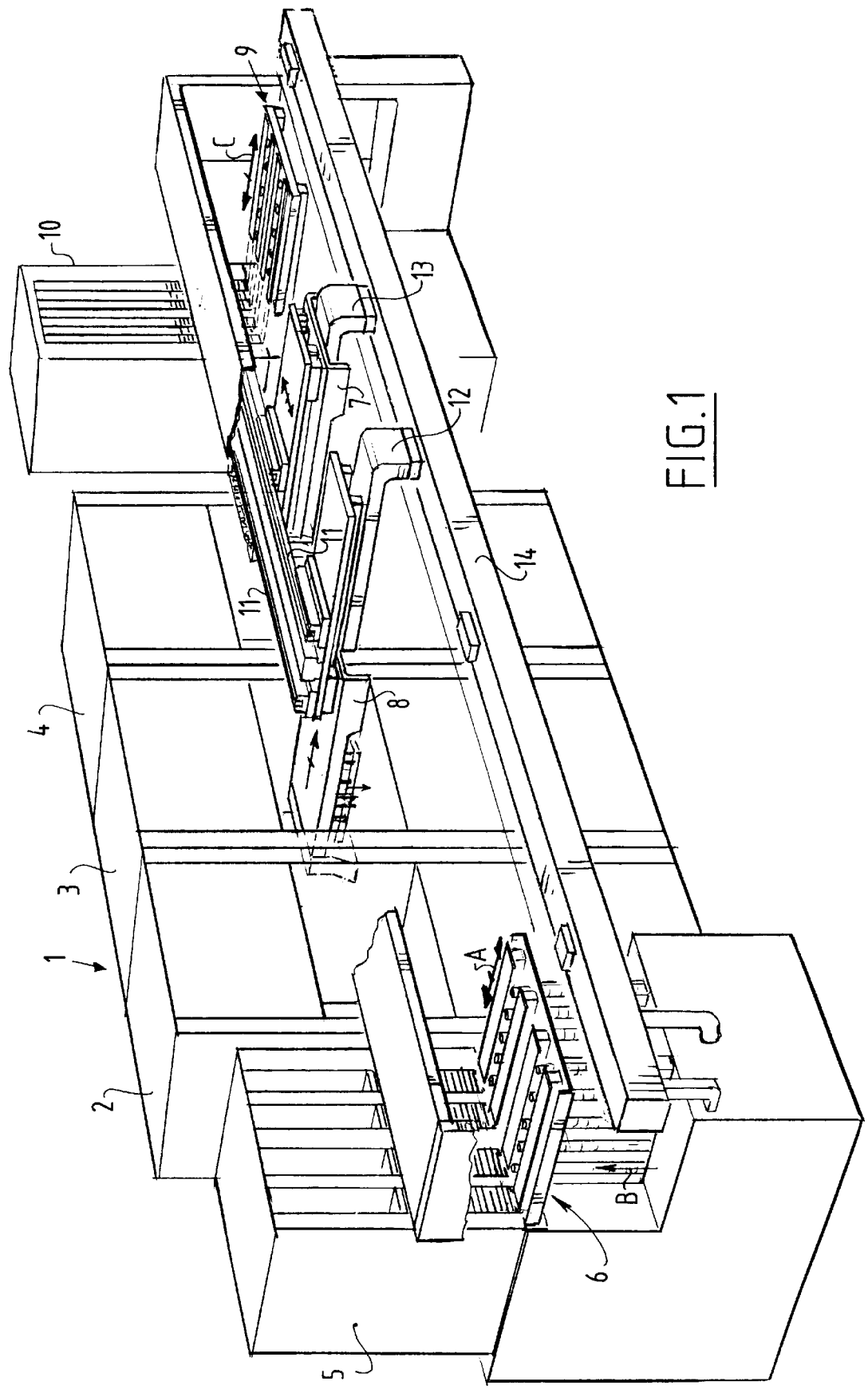
FIG. 1 shows a partly broken away rear view in perspective of a preferred embodiment of the apparatus according to the present invention.

A preferred embodiment 1 of an apparatus 1 according to the present invention comprises a plurality of, in the present case three, presses 2, 3 and 4 for encapsulating with epoxy resin lead frames L which are supplied from the supply module 5. Using a transfer mechanism 6 which is movable in the directions of the double arrow A the lead frames are transferred from supply module 5 to a first supply carriage 7. Pellet-shaped capsules of the encapsulating material are also transferred in the direction of the arrow B by transfer device 6. The encapsulated lead frames are removed from respective presses 2, 3 and 4 using a second discharge carriage 8 and subsequently transferred via a second transfer device 7—movable in the directions of double arrow C—to a discharge module 8. In another embodiment (not shown) the supply module and discharge module are interchanged, i.e. the discharge module is situated on the left rear side while the supply module is situated on the right rear side.

The carriages 7 and 8 are movable between the first transfer module 6 and the presses respectively between the presses and the second transfer device 9 along the underside of a rail 11 and can be moved substantially transversely perpendicular to the direction of rail 11 between opened moulds of presses 2, 3 and 4. The first carriage 7 and the second carriage 8 are further provided with respective pneumatic conduits 12 and 13 which can be coupled actively in diverse positions to a suction conduit 14 for the various suction functions, which will be further elaborated hereinbelow. In a manner not shown the carriages 7 and 8 are connected to electric lines, for instance via a cable train, for power supply to the drives and for control signals.

Figure 2:
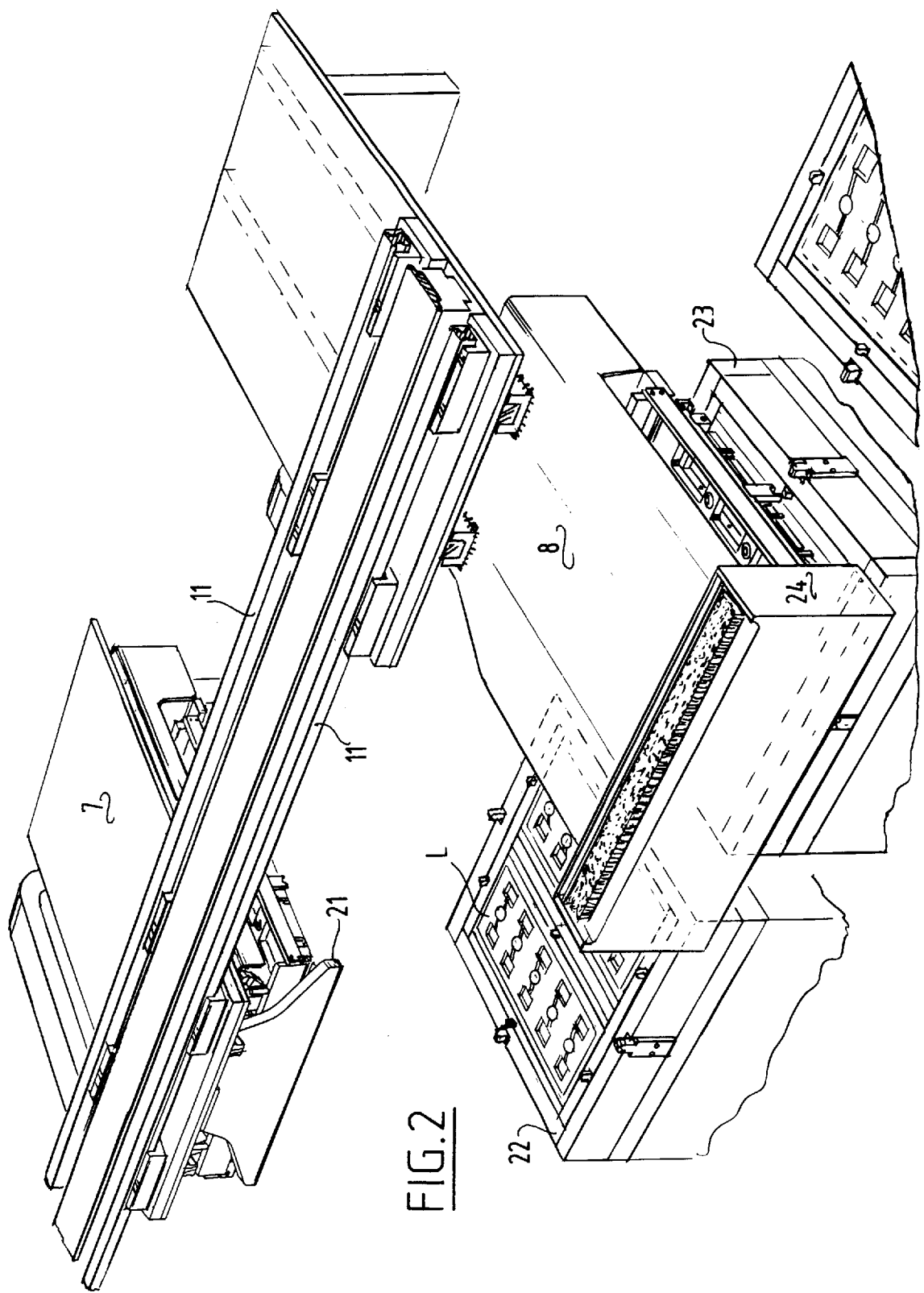
FIG. 2 shows an enlarged view in perspective of the carriages of FIG. 1.

As shown in FIG. 2, the supply carriage or slide 7 which places the lead frames in the opened mould in correctly positioned manner is provided on the front with a suction element 21 connected via a suction line to suction conduit 14 which substantially extends roughly parallel to the rail 11. Suction element 21 serves to suck clean the lower mould half prior to placing therein of the lead frames. In order to avoid a breakage in the air ducts both the supply carriage and the discharge carriage are preferably provided with tubular conduits slidable in and out of each other, while the pneumatic conduits 12 and 13 can operate in a manner not shown a closing member in the main pneumatic conduit 14.

The discharge carriage 8 for removing lead frames L from another mould half 23 simultaneously with placing of lead frames in a first mould half 22 is provided on the front side with a two-sided brush 24 which, after removal of the lead frames, brushes clean both the upper mould half (not shown) and the lower mould half 23 and which preferably also reduces as far as possible electrostatic charge present thereon. For this purpose the brushes can be deionized close to the discharge station or elsewhere. In preference the bristles of the brushes can (moreover) be embodied at least slightly conductively, for instance the plastic bristles are provided with a metallic coating to prevent build-up of electrostatic charge. It is also possible to choose a special composition for the bristles, for instance a mixture of stainless steel with plastic, this such that damage to the pressing device is avoided and no metallic material remains behind in the pressing device after brushing.

Figure 3:
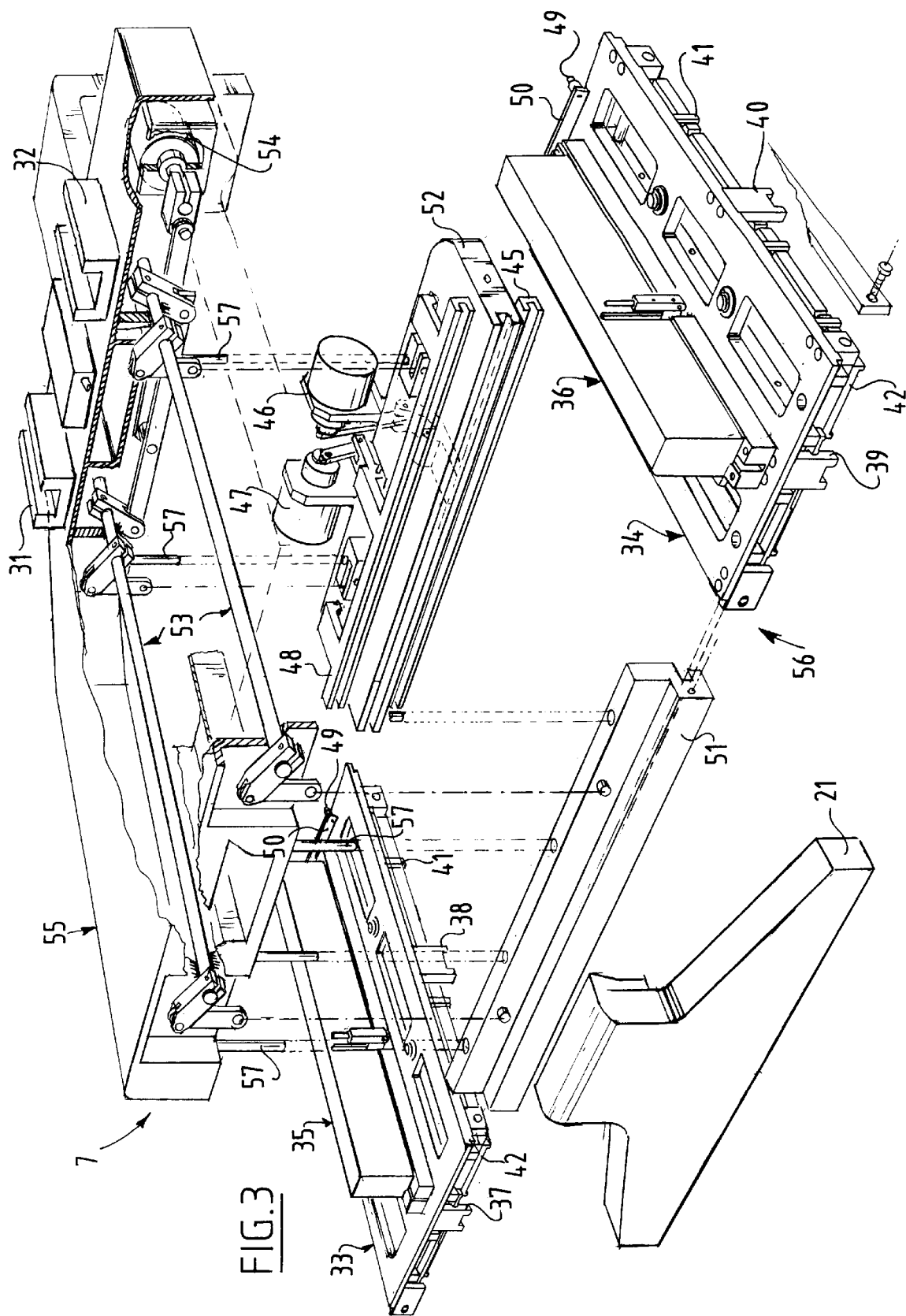
FIG. 3 shows an exploded view in perspective of diverse components on a carriage.
Figure 4:
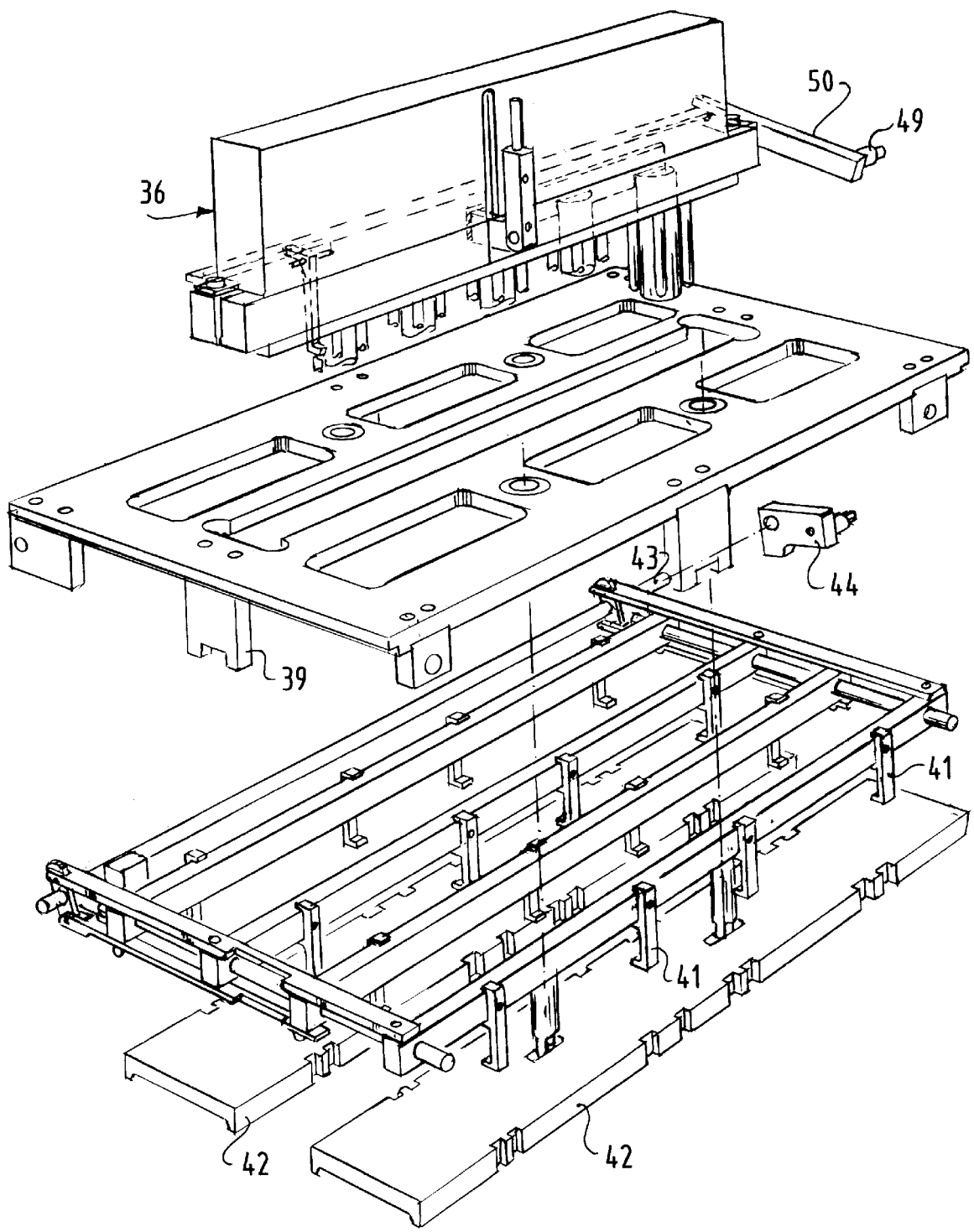
FIG. 4 shows an exploded view in perspective of further components on the carriages.
Figure 5:
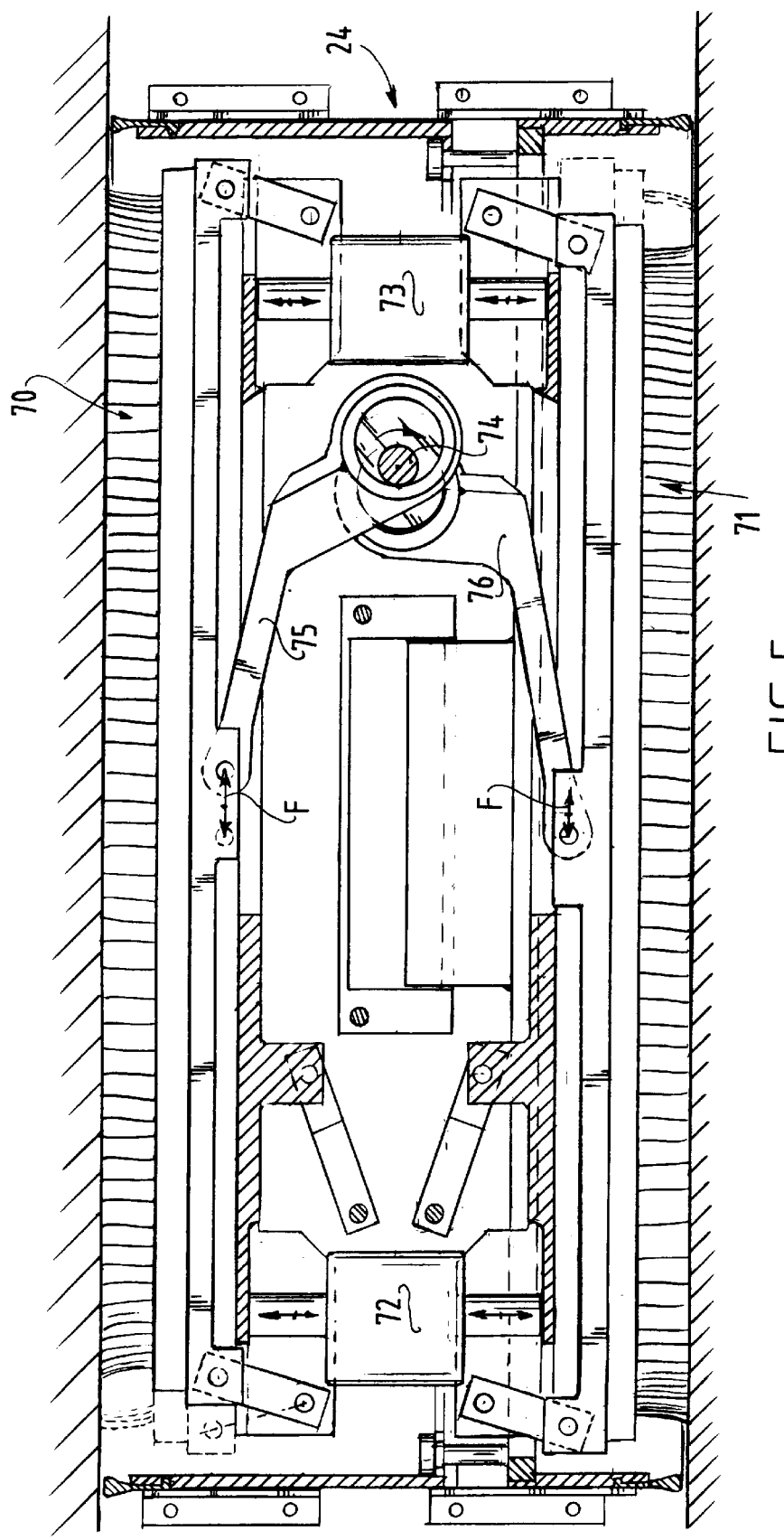
FIG. 5 is a cross-sectional view of the operation of the brushing means of the carriage of FIG. 2.

Both the supply carriage and discharge carriage are preferably constructed such that the number of components which must be changed in the case of different lead frames is limited to a minimum. Driving of the movement of the diverse components is situated as far as possible on the non-product-specific components. The supply carriage 7 (FIG. 3) which is movable in and out of the opened mould along rails (not shown) by means of carriage elements 31, 32 comprises in addition to suction mouth 21 two components 33 and 34 which are geared to relevant lead frames which have to be placed in a lower mould half and which are likewise provided with holders 35 respectively 36 in which are situated the pellets of encapsulating material. On the underside the components 33 respectively 34 are provided with positioning forks 37, 38, 39, 40 etc., which for correct positioning fit onto corresponding protruding parts of the mould halves. Components 33 and 34 are further provided on the underside with holding arms 41 provided with a hooked end (see also FIG. 4) for holding the lead frames fixedly between counter-plates 42 and the hooked ends thereof. The holding arms 41 are movable between a position fixedly holding the lead frames and a position releasing them by rotating a shaft 43 which is actuated via a transmission element 44 via control beam 45 which is driven in turn by drive motor 46. Drive motor 47 actuates a control beam 48 which is likewise provided with a groove into which in the assembled situation protruding pin parts 49 are inserted which via arms 50 drive respective control mechanisms for the components 35 and 36. The components 51 and 52 likewise provided with respective grooves are driven by a drive motor 54 via rod system 53, wherein the system of rods and the drive motor are situated in an upper part 55 of carriage 7. The upper part 55 and lower part 56 are coupled via sliding rods 57. In the bottom view of FIG. 4a, component 34 is shown in assembled situation, wherein the holder for the encapsulating material 36 is arranged thereon. In the bottom view of FIG. 4c is shown component 34', i.e. a component for the discharge carriage with suction mouths 61.

Figure 6:
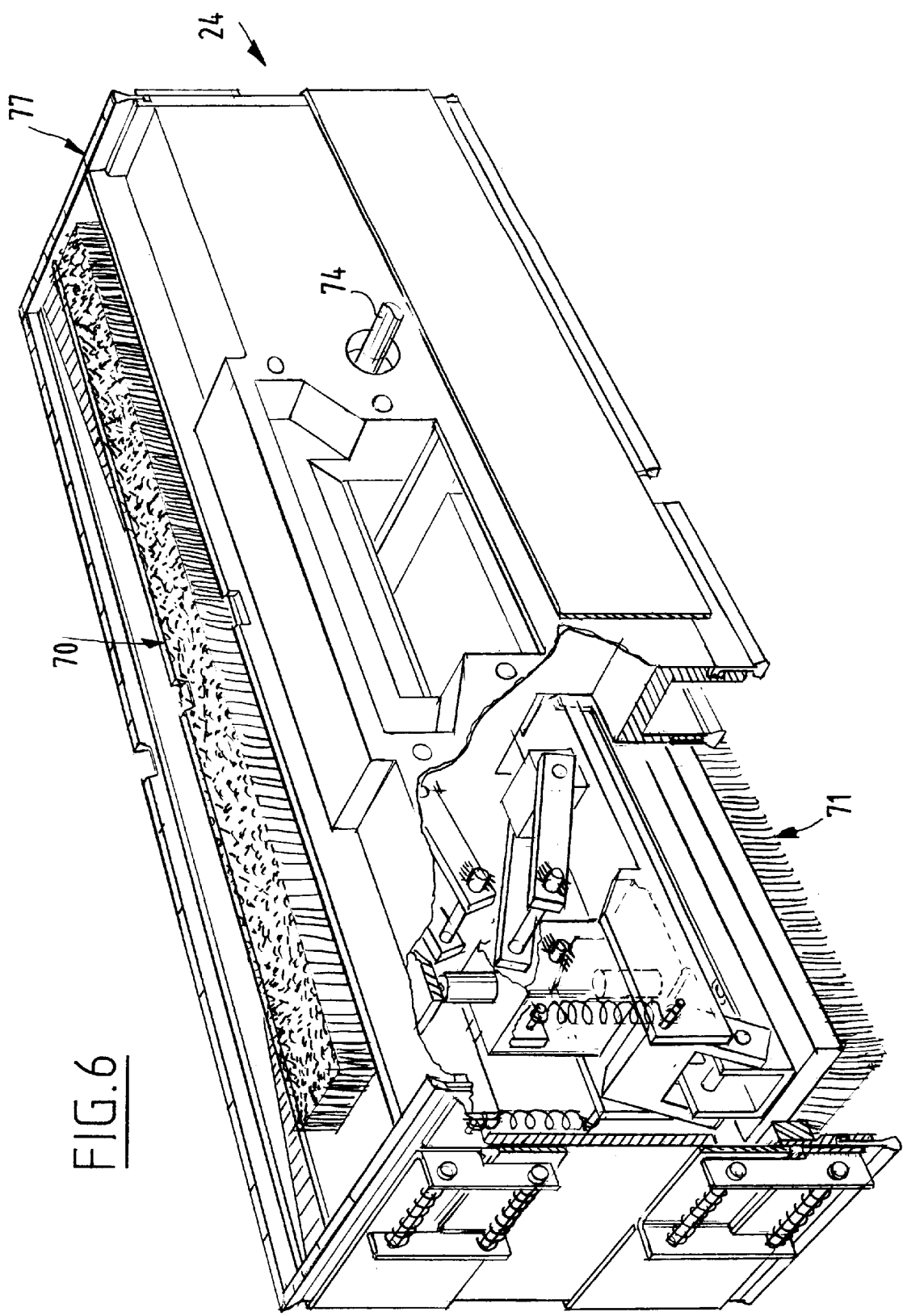
FIG. 6 is a partly broken away view in perspective of the brushing means of FIG. 5.

The discharge carriage 8 is provided with a brush element 24 with an upper brush 70 and a lower brush 71 for brushing clean both mould halves and further comprises cylinders 72 and 73, which urge the brushes outward when brushing action is required, and drive arms 75 and 76 which are driven eccentrically via a drive shaft 74 and which effect a reciprocating movement of brushes 70 and 71 as according to arrows F. Brush element 24 further comprises a closed housing 77 (FIG. 6) wherein a shaft 74 protrudes outward through an opening in this housing and can be driven externally.

Figure 7:
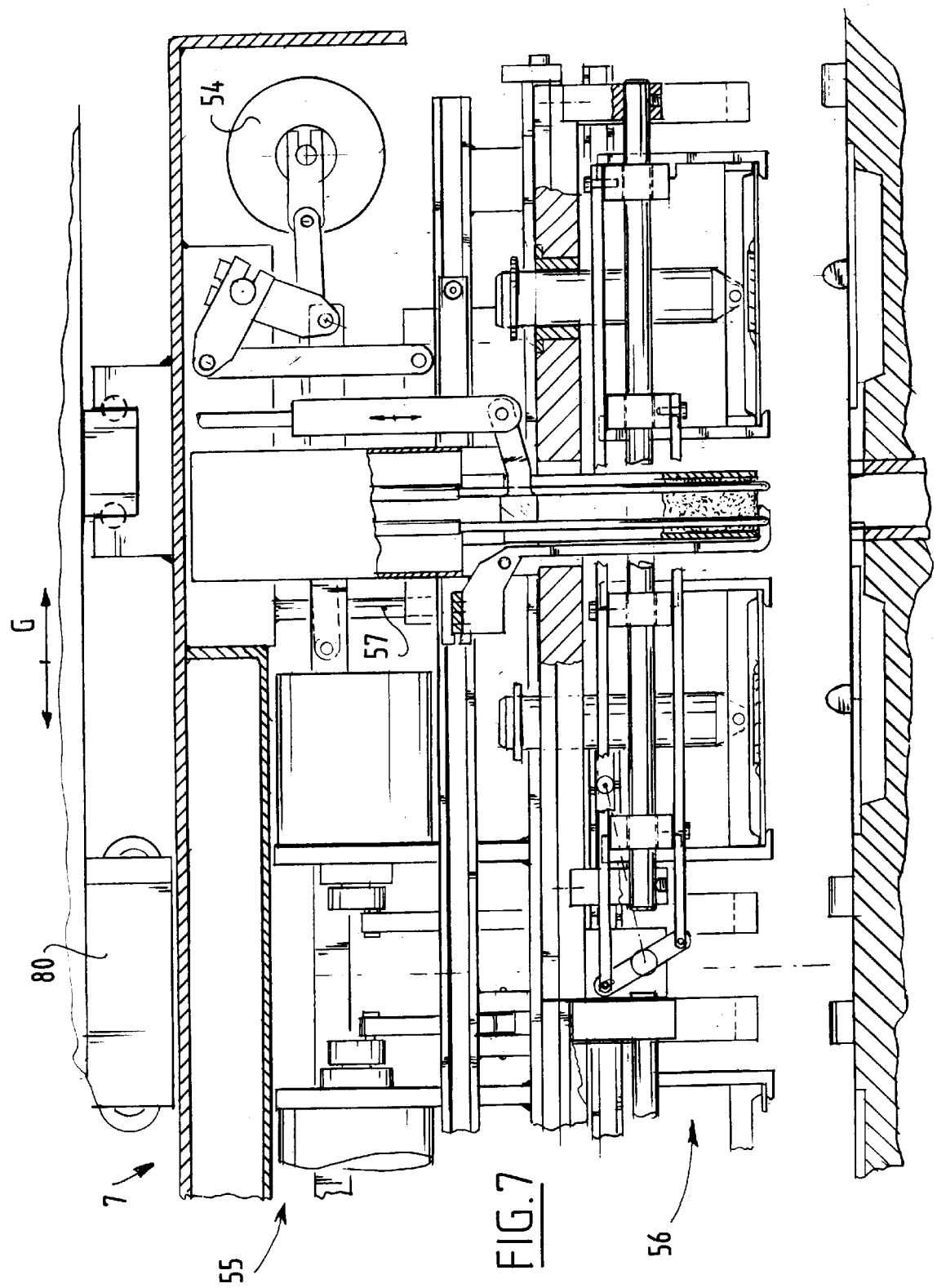
FIG. 7 is a side view, partly in cross section, of the carriage for introducing the lead frames into a press.
Figure 8:
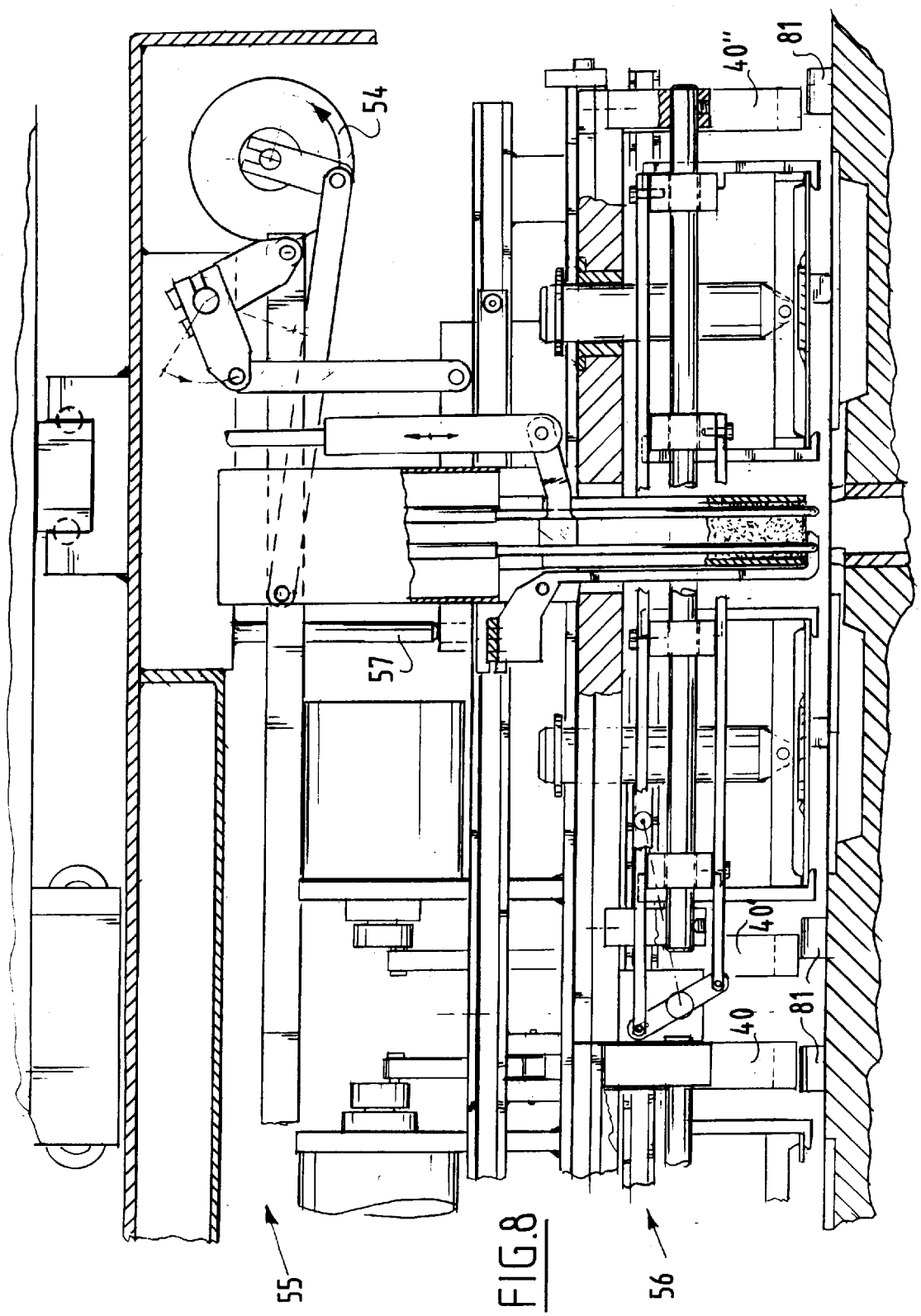
FIG. 8 shows the view of FIG. 7 in a second position.

In the positioning of for instance the supply carriage 7 (FIG. 7) a trolley 80 is first positioned precisely relative to a press as according to double arrow G, for instance in a manner not shown by means of sensors which are arranged in the centre of a press and which is in contact-free communication with sensors on the carriage. From the position shown in FIG. 7 the drive motor 54 is actuated and the lower part 56 of the carriage is moved downward relative to the upper part 55 along the guide rods 57 into the position shown in FIG. 8, wherein the lower part 56 is clear of the pins 57 and of the upper part 55. From this position shown in FIG. 8 the positioning legs 40, 40' and 40' provided with aligning surfaces can be positioned relative to protrusions 81 on the mould half using the drive motor 54.

Figure 9:
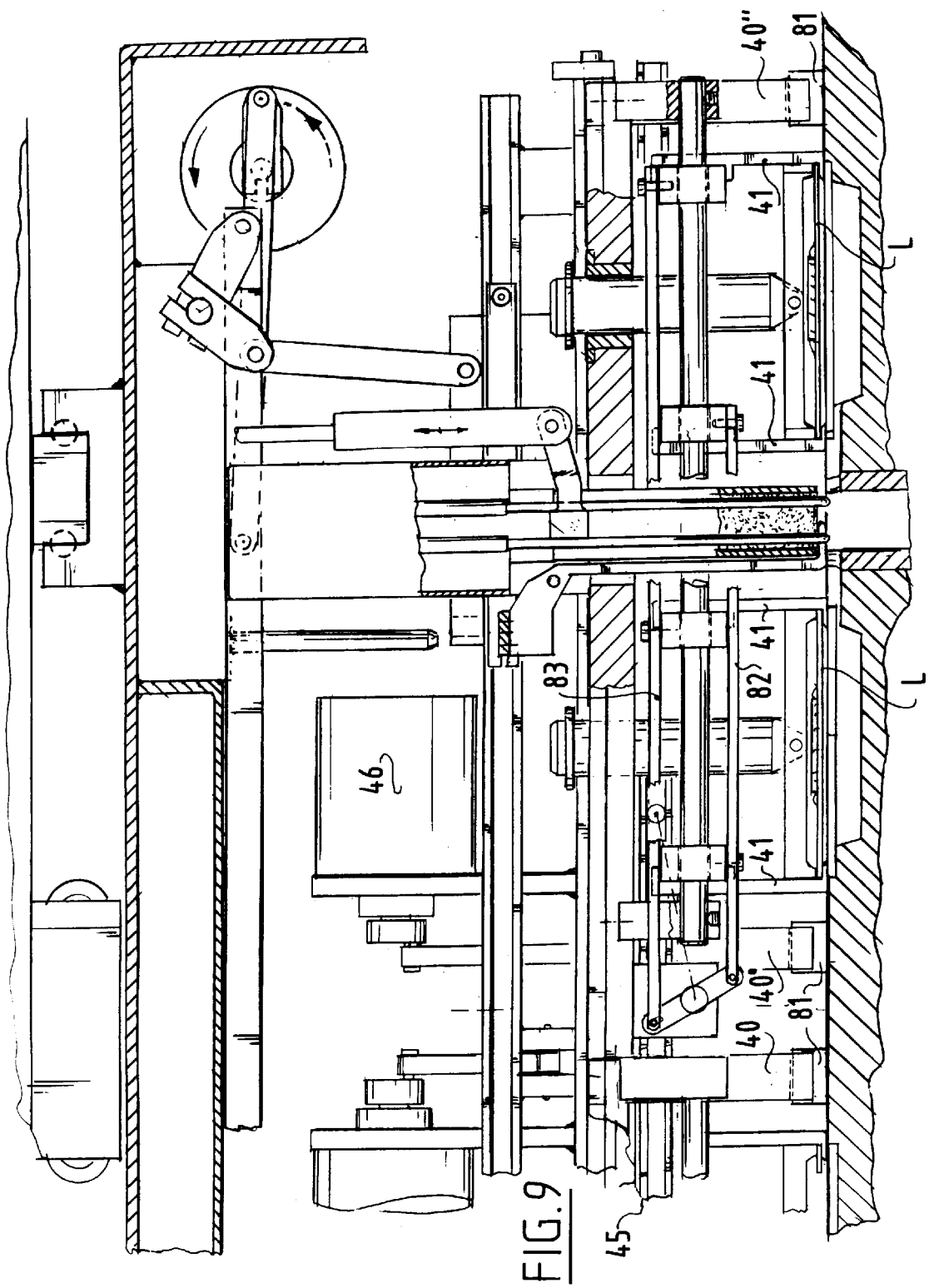
FIG. 9 shows the view of FIG. 7 in a third position.
Figure 10:
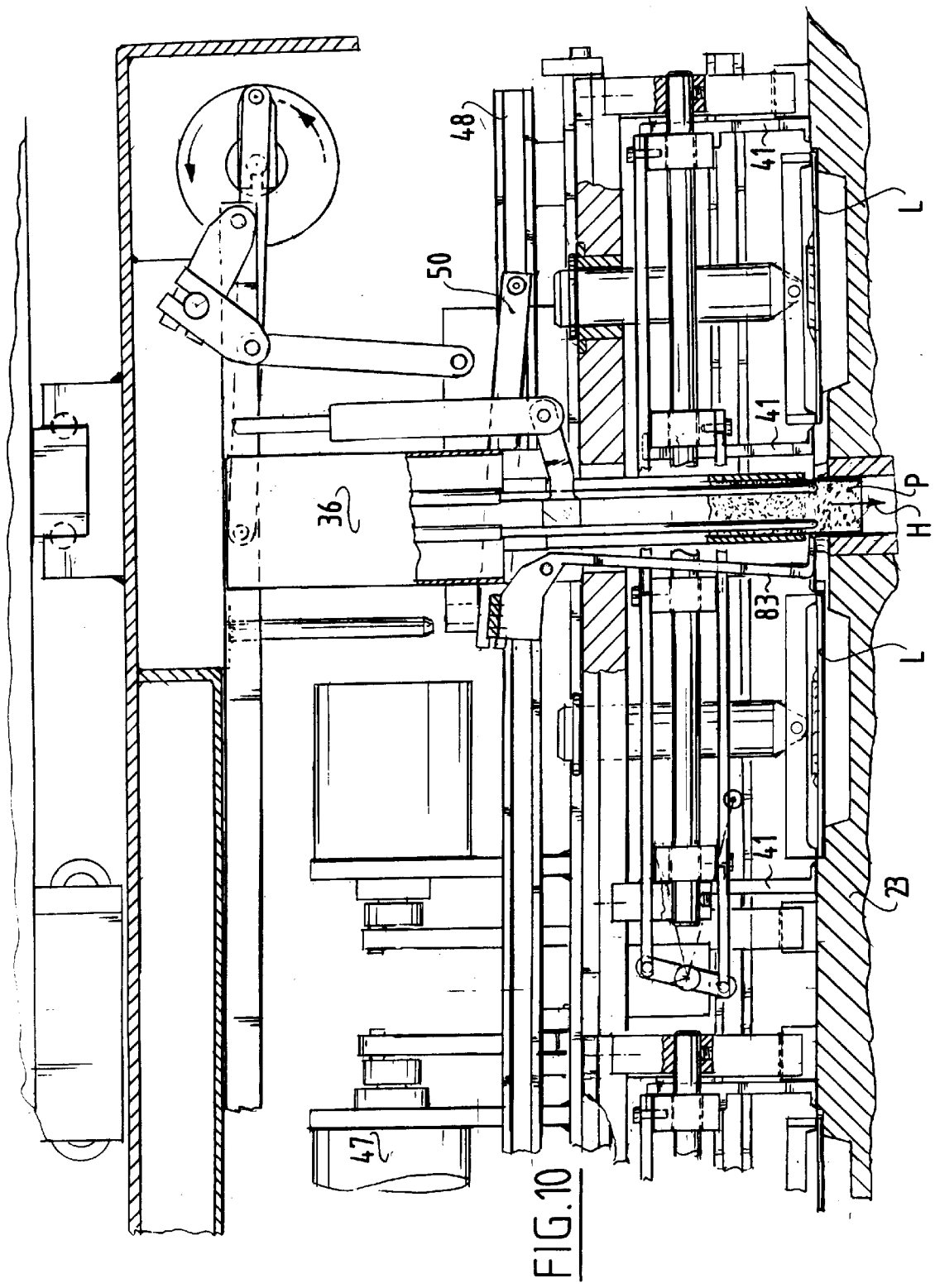
FIG. 10 shows the view of FIG. 7 in a fourth position.

In the position shown in FIG. 9 the legs 40, 40', 40" rest precisely on protrusions 81 and the lead frames L can be released by actuating drive motor 46 which operates the holding arms 41 via control beam 45 via rods 82 and 83. This position is shown in FIG. 10, wherein holding arms 41 are urged apart and the lead frames L are placed accurately positioned in lower mould half 23. By actuating drive motor 47 a predetermined quantity of plastic material P is simultaneously introduced in the direction of the arrow H at the correct location in the mould since an arm 83 is moved outward via arm 51 and control beam 48.

After the lead frames and the plastic material have been placed into the mould the above described movements of the drive motors take place in reverse direction and carriage 7 is taken out of the opened mould. Insertion (and removal) of lead frames in the mould can take place inside a few seconds, whereafter a relevant press can be closed and the encapsulating pressing process can be performed.

In order to shorten the opening time of a pressing device as much as possible, the carriages are controlled such that they stand ready as soon as a pressing device is opened. The lead frame is discharged from the opened pressing device by the discharge carriage, while the pressing device is brushed clean, immediately whereafter the supply carriage places a lead frame for encapsulating into this press, while the encapsulated lead frames are carried away by the discharge carriage to the discharge means. It is the intention that a press only has to remain open for 12–13 seconds, while the supply and discharge carriages are moved along the rails at high speeds such that every 20 seconds one of the three pressing devices can be loaded and offloaded.

Since the length of the rails amounts to several metres, the carriages must therefore be moved at great speed between the pressing device and the supply and discharge stations. Preferably used to drive the carriages is a so-called linear motor which over a distance of several metres ensures a displacement of the carriages relative to the rails with an absolute accuracy of 0.3 mm and a reproducible accuracy of 0.03 mm. In the first instance the carriages from the supply and discharge stations are positioned relative to the zero point defined by these stations within the accuracy of about 0.3 mm.

Due to the modular construction of the apparatus according to the present invention and due to expansion of diverse components in the case of temperature differences such as occur for instance during heating and cooling of the apparatus, it may however be necessary in the second instance to make the positioning of the carriages more precise and adapt the positioning to the changing conditions. For this purpose the diverse modules such as these supply stations, the discharge stations, the pressing devices and the carriages are provided in a manner not shown with sensors, for instance a photocell in the centre of each pressing device, while the carriage is provided with a flag which interrupts the light beam to the photocell. Since it is possible with such a photo-cell and flag to calibrate in accordance with both the falling edge and rising edge of the electric signal leaving the photocell, it has been found that the carriages can be positioned with an absolute accuracy of 0.1 mm relative to the diverse modules, and this has been found sufficient. This calibration at relatively low speed of the carriages is first carried out after the relevant carriages has been sent at high speed to roughly the correct position by the linear motor. Use of the linear motor gives the advantage here that at high speed a well-reproducible path is covered by the carriages while an exact positioning of the carriages is also ensured at low speed.

The present invention is not limited to the above described preferred embodiment thereof; the rights applied for are defined in the first instance by the following claims.

What is claimed is:

1. An apparatus for encapsulating products, comprising:
    a pressing device for encapsulating the products at an increased pressure or temperature;
    a first carriage device for transferring the products from a supply means to the pressing device; and
    a second carriage device for discharging encapsulated products from the pressing device to a discharge means, wherein the first and second carriage devices are guidable along collective guide means, and wherein the first and second carriage devices move independently of each other and adjacent a same side of said pressing device.

2. The apparatus of claim 1, wherein the guide means comprises one or more rails, along the underside of which the carriages are movable.

3. The apparatus of claim 1 further comprising a pneumatic conduit substantially parallel to the guide means, wherein the first and second carriage devices are provided with a coupling piece for coupling thereof to the pneumatic conduits, thereby connecting the carriage devices with a pneumatic system when the carriage devices are located in a specific position.

4. The apparatus of 1, wherein the carriage devices comprise a lower part and an upper part, wherein the lower part comprises a holder with a holding means which is suitable for particular products and the upper part comprises a drive means for driving the holding means between a fixedly holding position and a releasing position.

5. The apparatus of claim 1 further comprising brushing means and drive means for driving the brushing means to perform a brushing action.

6. The apparatus of claim 4, wherein capsules of the encapsulating material are arranged on the lower part of the carriage devices.

7. The apparatus of claim 4 wherein the lower part of the carriage devices is provided with a positioning means for positioning one of the carriage devices relative to a pressing device.

8. The apparatus of claim 4 wherein the lower part of the carriage devices and the upper part of the carriage devices are movable relative to each other along slide pins.

9. The apparatus of claim 4 wherein drive means for the holding means are coupled thereto by means of a beam provided with a groove.

10. The apparatus of claim 1 further comprising drive means for driving the carriage devices, the drive means comprising a linear electric motor.

11. The apparatus of claim 1 further comprising transverse guide means and one or more second linear electric motors for driving the carriage devices along the transverse guide means.

12. The apparatus of claim 1 wherein at least one carriage device is provided with tubular conduits slidable in and out of each other for ensuring the connection to the pneumatic conduits in an airtight manner during transverse movement of the carriage device.

13. An apparatus for encapsulating products comprising:
    one or more pressing devices for encapsulating the products at increased pressure and temperature;
    one or more carriage devices for transferring the products from a supply means to the pressing devices and for discharging the encapsulated products from the pressing devices to a discharge means, and drive means for driving the carriage devices along a collective guide means, the drive means comprising a linear motor, wherein the carriage devices move independently of each other and adjacent a same side of said pressing devices.

14. The apparatus of claim 13, further comprising sensor means for accurately determining the position of the carriage devices relative to the pressing devices.

15. An apparatus for encapsulating products, comprising:
    one or more pressing devices for encapsulating the products at increased pressure and temperature;
    a pneumatic conduit proximate to the pressing devices and including a closable valve member; and
    one or more carriage devices for transferring the products from a supply means to the pressing devices and for discharging the encapsulated products from the pressing devices to a discharge means, wherein the carriage devices are provided with a coupling piece for coupling to the pneumatic conduit and for operating the closing member and tubular conduits slidable in and out of each other, wherein the carriage devices move independently of each other and adjacent a same side of said pressing devices.

16. An apparatus for encapsulating products, comprising at least one carriage device which includes a brushing member having at least a number of bristles which are comprised of electrically conducting material, wherein the carriage device moves independently of any additional carriage devices and adjacent a same side of a pressing device.

17. The apparatus of claim 1, further comprising sensor means for accurately determining the position of the carriage devices relative to the pressing devices.

* * * * *